United States Patent [19]
Suzuki

[11] Patent Number: 6,096,462
[45] Date of Patent: Aug. 1, 2000

[54] CHARGED-PARTICLE-BEAM-PROJECTION-MICROLITHOGRAPHY TRANSFER METHODS WITH COULOMB EFFECT CORRECTION

[75] Inventor: Shohei Suzuki, Tokyo, Japan

[73] Assignee: Nikon Corporation, Tokyo, Japan

[21] Appl. No.: 09/394,854

[22] Filed: Sep. 13, 1999

Related U.S. Application Data

[62] Division of application No. 09/146,061, Sep. 2, 1998.

[30] Foreign Application Priority Data

Sep. 2, 1997 [JP] Japan ................... 9-237363

[51] Int. Cl.$^7$ ........................................ G03F 9/00
[52] U.S. Cl. ............................ 430/30; 430/296
[58] Field of Search ........................... 430/30, 296

[56] References Cited

U.S. PATENT DOCUMENTS 5,260,151 11/1993 Berger et al. .................... 430/5
5,269,151 12/1993 Dinh ................................. 62/81

*Primary Examiner*—Christopher G. Young
*Attorney, Agent, or Firm*—Klarquist Sparkman Campbell Leigh & Whinston, LLP

[57] ABSTRACT

A charged-particle-beam pattern-transfer apparatus is provided wherein a CPB is emitted from the CPB source, is focused by first and second condenser lenses, and is illuminated onto a mask. A deflector deflects the CPB to a selected subfield of the mask. The CPB transmitted by subfield is projected by a first projection lens toward a back-focal-plane aperture. The portion of the CPB that passes through the back-focal-plane aperture is projected by a second projection lens onto a wafer. Coulomb effect induced shifts in focal-point position, and changes in image magnification, projected-image rotation, and astigmatic blur and astigmatic distortions of the image are each corrected by application of electric current supplied to each component of a correction system, the correction system preferably comprising a set of correction lenses and two stigmators.

5 Claims, 2 Drawing Sheets

Calculation of the CPB current at the wafer surface and the pattern distribution within the selected mask subfield

↓

Calculation of the shift in the focal-point position, magnification, rotation, astigmatic blur, and astigmatic distortion, due to Coulomb effects

↓

Adjustment of the excitation current supplied to the correction lenses and stigmators

↓

Exposure of a selected subfield 60

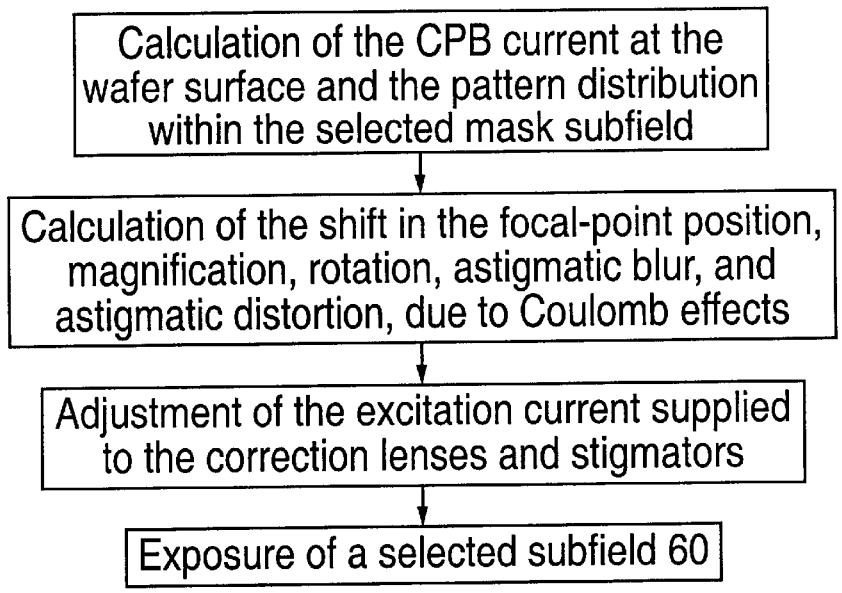
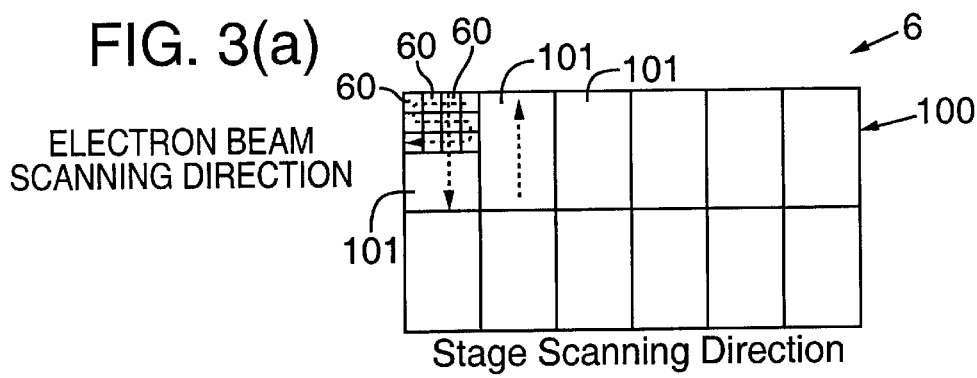
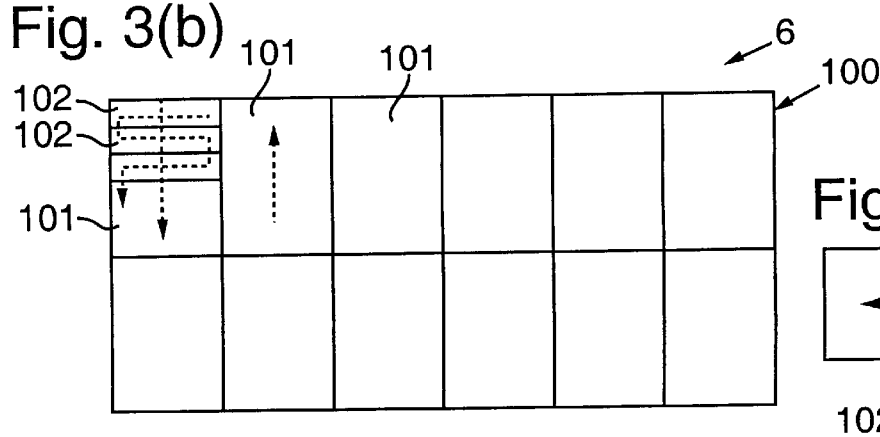
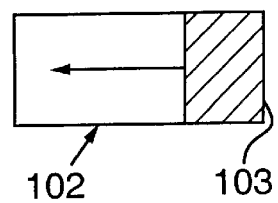

CHARGED-PARTICLE-BEAM-PROJECTION-MICROLITHOGRAPHY TRANSFER METHODS WITH COULOMB EFFECT CORRECTION

This application is a Divisional of Ser. No. 09/146,061, filed Mar. 2, 1998.

TECHNICAL FIELD OF THE INVENTION

The invention pertains to charged-particle-beam projection-microlithography apparatus and transfer methods for transferring a pattern from a mask onto a sensitized substrate. More specifically, the invention pertains to projection apparatus and transfer methods that achieve precise correction of low-order distortions and aberrations of transferred images caused by Coulomb effects.

BACKGROUND OF THE INVENTION

In charged-particle-beam (CPB) projection microlithography as used in the fabrication of integrated circuits, a circuit pattern defined by a reticle or mask is irradiated with a charged-particle beam (e.g., an electron beam) to transfer the pattern defined by the reticle or mask to a sensitized substrate (e.g., a semiconductor wafer). With certain conventional CPB projection-microlithography apparatus ("pattern-transfer apparatus"), one or more entire die patterns defined on a mask are transferred onto the wafer in a single exposure. Such a scheme is termed "batch exposure," and a "die" is a pattern coextensive with the bounds of an integrated circuit or other device to be transferred onto the wafer (usually multiple dies are exposed at respective locations on the wafer).

Unfortunately, although conventional batch pattern-transfer apparatus achieve good throughput (i.e., the number of semiconductor wafers that can be exposed with a pattern per unit time), such apparatus cannot provide the high resolution and integration densities necessary to produce the semiconductor integrated circuits demanded in recent years. Specifically, it is difficult to produce a mask for batch transfer. In addition, conventional batch pattern-transfer apparatus have projection-optical systems in which the optical field is very large. Such projection-optical systems cannot satisfactorily control aberrations arising in the projection-optical system especially over such a large optical field.

To solve this problem, CPB pattern-transfer apparatus have been proposed in which the pattern to be transferred is divided into multiple field segments that are individually and separately exposed. Each field segment is typically further divided into multiple "mask subfields." Each mask subfield is typically rectangular with an area of hundreds of square micrometers. The mask subfields are typically transferred using a "step-and-repeat" transfer scheme in which the individual mask subfields are sequentially exposed onto corresponding "substrate subfields" on a wafer or other sensitized substrate. The substrate subfields are produced on the wafer surface in locations relative to each other such that the substrate subfields are "stitched" together in the correct order and alignment to reproduce the entire die pattern on the wafer surface (e.g., see U.S. Pat. No. 5,260,151). Such a transfer scheme is typically referred to as "divided exposure" mask pattern transfer.

Conventional CPB pattern-transfer apparatus ("divided-projection apparatus") employing a mask segmented into subfields that are individually projected onto the wafer utilize projection-optical systems having a much smaller optical field than batch systems. As a result, compared to the batch systems, exposure of the mask pattern can be performed with better control of aberration such as field curvature, astigmatic blur and distortion.

However, in conventional CPB pattern-transfer apparatus, e.g., variable-beam-shaping (VBS) apparatus and cell-projection apparatus, a phenomenon known as a Coulomb effect can cause the focal-point position of a projected image to shift downstream along the optical axis. Focal-point shifting due to the Coulomb effect is dependent upon, inter alia, the total amount of current transmitted through the shaping aperture or cell patterns. Certain conventional CPB pattern-transfer apparatus (e.g., VBS or cell-projection apparatus) may correct axial shifting of the focal point. Such correction is usually performed using a "refocusing lens" that adjusts the focal-point position based on the transmitted current. A refocusing lens may also be used for divided-exposure transfer schemes to correct axial shifting of the focal point.

The Coulomb effect arises by mutual repulsion of the charged particles in the charged particle beam. In addition to causing axial shifting of the focal-point position, the Coulomb effect typically causes distortions and blurs of projected images. For VBS and cell-projection systems, Coulomb effect induced distortions and blurs are not a problem due to the relatively small optical fields (e.g., about 5 $\mu$m×5 $\mu$m). However, if the size of the optical field to be projected were to be substantially increased to, e.g., hundreds of square micrometers, then projected image distortions and blur induced by the Coulomb effect would be correspondingly increased. The lowest order distortions caused by the Coulomb effect are linear distortions, which include magnification error, rotation error, and astigmatic-distortion error. For example, the lowest-order distortion corresponds to an image magnification change of $\frac{1}{10000}$, and/or an image rotation of 10 $\mu$rad. For conventional exposure systems such as VBS or cell-projection apparatus wherein the subfields are generally about 5 $\mu$m$^2$, the magnification error is typically less than 1 nm. However, with divided-exposure pattern-transfer systems, the subfields are typically several hundred square micrometers. Such distortions are then in the order of tens of nanometers, which distortions cannot be ignored. Thus, projected-image distortions of such magnitude must be corrected to provide integrated circuits having the high resolution and integration densities demanded in recent years.

Accordingly, there is a need for CPB pattern-transfer apparatus and methods for transferring a pattern from a divided-mask pattern onto a sensitized substrate with precise correction of focal-point shifting, low-order distortions, and blur of transferred images caused by the Coulomb effect.

SUMMARY OF THE INVENTION

In light of the foregoing deficiencies in the prior art, the present invention provides charged-particle-beam pattern-transfer apparatus (CPB apparatus) and transfer methods for transferring a pattern from a mask onto a sensitized substrate with accurate and precise transfer of the mask pattern images even when the transverse profile of the optical field is relatively large (i.e., in the order of hundreds of square micrometers).

More specifically, a preferred embodiment of a CPB apparatus according to the present invention comprises, along an optical axis in the trajectory direction of a charged-particle beam, a CPB source for emitting the charged particle beam. First and second condenser lenses are positioned downstream of the CPB source to irradiate the charged particle beam in a direction toward a mask. A deflector may be used to deflect the beam that passes through the first and second condenser lenses onto a selected subfield of the mask. The mask defines a pattern that is divided into multiple subfields.

First and second projection lenses are positioned downstream of the mask to form an image of the transmitted mask-subfield pattern onto a sensitive substrate. Each of the projection lenses is adapted to receive an electric potential from a power supply.

The CPB apparatus also comprises a controller including an arithmetic/logic unit connected to a memory device. An input device is connected to the controller for the input of data to the memory device to be used in calculations by the arithmetic-logic unit for the correction of focal-point position shifting and/or distortions and blur of projected images.

A correction system is preferably situated between the mask and substrate. The correction system preferably comprises a set of correction lenses including a focal-point-shifting lens, a magnification-correction lens, and a rotation-correction lens. Each of these three correction lenses is adapted to receive a respective electric current. Each correction lens is connected to and controlled by the controller. The correction system further comprises a first stigmator positioned downstream of the magnification-correction lens to correct for astigmatic distortion (or aberrations) of projected images, i.e., orthogonality error and anisotropic-magnification error, induced by the Coulomb effect. A second stigmator may be positioned downstream of the first stigmator. The first and second stigmators may be operated independently of one another to correct astigmatic aberrations of projected images.

During operation of the CPB pattern-transfer apparatus, a charged particle beam is emitted from the CPB source. The beam is illuminated onto the mask by the first and second condenser lenses. The deflector deflects the charged particle beam to a selected subfield of the mask. The beam transmitted by the selected subfield is projected by the first and second projection lenses onto the wafer. Shifts in focal-point position, and changes in image magnification, projected-image rotation, and astigmatic blur and distortion of the image as caused by the Coulomb effect are each independently corrected by application of respective electric currents to each component of the correction system.

The foregoing and other objects, features, and advantages of the invention will become more apparent from the following detailed description of preferred embodiments which proceed with reference to the accompanying drawings.

BRIEF DESCRIPTION OF THE DRAWINGS

FIG. 2 is a flowchart illustrating a preferred embodiment of a pattern-transfer method according to the present invention.

FIG. 3(a) is a partial plan view of a mask showing the scan area and the scan direction of a charged-particle beam according to the preferred embodiment of the method.

FIG. 3(b) is a partial plan view of a mask showing the scan area and the scan direction of a charged-particle beam according to an alternative embodiment of a method according to the present invention.

FIG. 3(c) is a partial plan view of a mask showing the scan area (and scan direction) in the XY plane within a main field of the mask shown in FIG. 3(b).

DETAILED DESCRIPTION OF THE INVENTION

Figure 1:
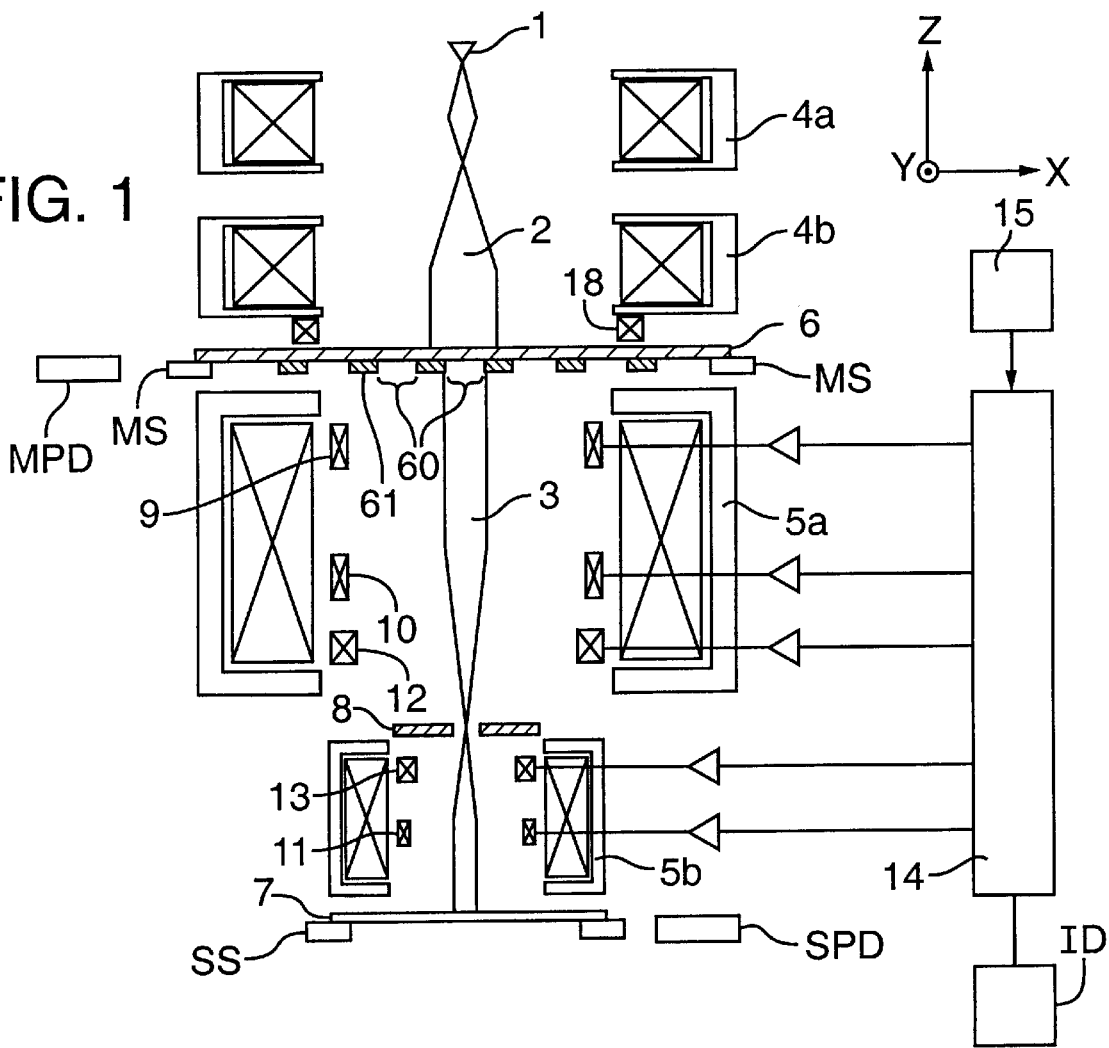
FIG. 1 is an elevational schematic diagram of a preferred embodiment of a charged-particle-beam pattern-transfer apparatus according to the present invention.

A preferred embodiment of a charged-particle-beam (CPB) pattern-transfer apparatus (CPB apparatus) according to the present invention is shown in FIG. 1. In FIG. 1, the Z-axis is parallel to the initial trajectory axis (optical axis AX) of a CPB, the X-axis extends in a direction horizontal with the plane of the page, and the Y-axis extends in a direction perpendicular to the plane of the page.

Although the present invention is, primarily, described with reference to use of a mask, it will be understood by those persons skilled in the art that the apparatus and methods of the present invention apply equally well to other CPB reticles.

The FIG. 1 embodiment comprises, along the optical axis AX in the trajectory direction of a charged particle beam (beam) 2, a CPB source 1 for emitting the beam. First and second condenser lenses 4a, 4b are positioned downstream of the CPB source 1 to irradiate the beam 2 in the Z direction toward a mask 6. A deflector 18 may be used to deflect the beam 2 that passes through the condenser lenses 4a, 4b onto a selected subfield 60 on the mask 6.

The mask 6 as shown in FIG. 1 is a scattering mask. The mask may, however, be any suitable CPB mask, e.g., a conventional stencil mask or a scattering stencil mask. The scattering mask 6 shown in FIG. 1 defines a pattern that is divided into multiple subfields 60. Each subfield 60 is preferably separated from other subfields 60 by a non-pattern region 61.

The mask 6 is preferably mounted on a mask stage MS and extends in the X–Y plane. The mask stage MS is preferably movable along the X-axis and Y-axis directions. Such movement of the mask stage MS is preferably controlled by a controller 14. The position of the mask 6 along the X-axis and Y-axis is preferably detected by a mask-position detector MPD, such as a laser interferometer that is connected to and controlled by the controller 14 and provides data indicative of the detected position of the mask 6 to the controller 14.

First and second projection lenses 5a, 5b are positioned downstream of the mask 6 to form an image of the transmitted mask-subfield pattern onto a sensitive substrate 7 (e.g., a semiconductor wafer). Each of the projection lenses 5a, 5b is adapted to receive a respective electric current. The sensitive substrate 7 is preferably mounted on a substrate stage SS and extends parallel to the XY plane. As effected by the substrate stage SS, the sensitive substrate 7 is movable in the X and Y axes directions. The upstream-facing surface of the sensitive substrate 7 is typically coated with a suitable resist or other "sensitizing" substance that is sensitive to exposure to the particles in the beam in an image-forming way. The substrate stage SS is preferably connected to and controlled by the controller 14. A substrate-position detector (not shown) may be connected to the controller 14 to determine the position of the substrate 7 along the X and Y axes. The substrate-position detector preferably comprises a laser interferometer that provides data indicative of the position of the substrate 7 to the controller 14.

The controller 14 preferably comprises an arithmetic/logic unit connected to a memory device 15. An input device (not shown) may be connected to the controller 14 for the input of data to the memory device 15 to be used in calculations for the correction of focal-point position shifting and/or distortions and aberrations of projected images (as discussed below).

Further with respect to FIG. 1, a correction system is preferably situated between the mask 6 and substrate 7. The correction system preferably comprises a set of "correction lenses" 9, 10, 11 to correct focal-point shifting, magnification-error, and rotation of the projected image. The relative position of each of the correction lenses 9, 10, 11 between the mask 6 and substrate 7 can be changed, and is typically determined based on the total distortion and blur exhibited by the combination of the correction system and first and second projection lenses. The correction system 9, 10, 11 may comprise multiple lenses, e.g., more than three lenses. The correction lenses 9, 10, 11 are adapted to receive respective electric currents and each lens is connected to and controlled by the controller 14. The correction system preferably further comprises more than two stigmators, as discussed below.

A back-focal-plane aperture 8 is preferably positioned at the back-focal-plane of the first projection lens 5a. The back-focal-plane aperture 8 blocks out charged particles that are scattered at relatively large angles by the mask 6.

A first astigmatism-correction lens or first stigmator 12 a second astigmatism-correction lens or second stigmator 13 are preferably positioned downstream of the magnification-correction lens 10 and upstream of the back-focal-plane aperture 8 to correct for aberrations of projected images, i.e., astigmatic blur or astigmatic distortion, caused by the Coulomb effect. A second astigmatism-correction lens or second stigmator 13 is preferably positioned downstream of the back-focal-plane aperture 8 and upstream of the rotation-correction lens 11. The relative positions of the stigmators 12, 13 between the mask 6 and the substrate 7 can be adjusted based on the total distortion and blur of particular pattern-transfer apparatus. The first and second stigmators 12, 13 preferably each comprise two quadrupoles, each quadrupole of each set may be independently energized by application of a respective electric current thereto.

During operation of the pattern-transfer apparatus of FIG. 1, a CPB 2 is emitted from the CPB source 1. The beam 2 is illuminated onto the mask 6 by the first and second condenser lenses 4a, 4b. The deflector 18 deflects the beam 2 to a selected subfield 60 of the scattering mask 6. The beam 2 transmitted by the selected subfield 60 is projected by the first and second projection lenses 5a, 5b onto the wafer 7.

The magnitudes of the respective electric currents supplied to the projection lenses 5a, 5b are adjusted such that the focal-point position of the projected image is precisely positioned at the upstream surface of the wafer 7 with a relatively low current of the beam 2. Accordingly, if the current density of the beam 2 is increased, the focal-point position of the projected image moves further downstream along the optical axis AX, due to the Coulomb effect. The focal-point position, image magnification, and projected-image rotation are each corrected using the correction lenses 9, 10, 11.

According to a preferred method of the present invention, the magnitudes of the respective electric currents supplied to the correction lenses 9, 10, 11 are I9, I10, and I11, respectively. The focal-point-position correction amount $\Delta z$, the magnification-correction amount $\Delta m$, and the rotation-correction amount $\Delta \theta$ are approximated by the following equations:

$$\Delta z = a(1, 9) \cdot I9 + a(1, 10) \cdot I10 + a(1, 11) \cdot I11 \quad (1)$$

$$\Delta m = a(2, 9) \cdot I9 + a(2, 10) \cdot I10 + a(2, 11) \cdot I11 \quad (2)$$

$$\Delta \theta = a(3, 9) \cdot I9 + a(3, 10) \cdot I10 + a(3, 11) \cdot I11 \quad (3)$$

wherein a(1, j), a(2, j), and a(3, j) are sensitivity coefficients of each lens 9, 10, 11 that may be determined by computer simulation based on the design and configurations of the correction lenses 9, 10, 11, respectively (j=9–11). Exact values of a(1, j), a(2, j), and a(3, j) may, alternatively, be determined by actual measurement.

The first and second stigmators 12, 13 are energized to generate astigmatic blur and astigmatic distortion to compensate for the astigmatic blur and astigmatic distortion of the projected image. While corrections for astigmatic blur have conventionally been made, correction for astigmatic distortion has not previously been performed. Accordingly, the present invention provides the following equations for expressing astigmatic distortion:

$$\Delta X = \alpha X + \beta Y \quad (4)$$

$$\Delta Y = \beta X - \alpha Y \quad (5)$$

wherein X and Y represent positional coordinates within a selected illuminated subfield on the substrate, $\Delta X$ and $\Delta Y$ represent astigmatic distortion amounts in each of the X-axis and Y-axis directions, respectively, and $\alpha$ and $\beta$ are distortion coefficients.

As discussed above, each of the stigmators 12, 13 can be configured as two sets of quadrupoles comprising four pairs of poles. Each pair of quadrupoles of the first and second stigmators 12, 13 is energized independently (i.e., a respective electric current may be separately supplied to each pair of quadrupoles). For example, if the magnitudes of the respective electric currents supplied to each pair of quadrupoles of the stigmator 12 are denoted Ir(12) and Ib(12), then the net magnitude of electric current Is(12) supplied to the stigmator 12 may be expressed in complex form as follows:

$$Is(12) = Ir(12) + i \cdot Ib(12) \quad (6)$$

wherein i is $(-1)^{1/2}$.

Denoting the respective net electric-current magnitudes of stigmators 12, 13 as Is(12) and Is(13), respectively, the amount of astigmatic-blur $\Delta M_{ast}$ and the amount of astigmatic distortion $\Delta M_{dis}$ generated by the first and second stigmators 12, 13 may be expressed as follows:

$$\Delta M_{ast} = b(1, 12) \cdot Is(12) + b(1, 13) \cdot Is(13) \quad (7)$$

$$\Delta M_{dis} = b(2, 12) \cdot Is(12) + b(2, 13) \cdot Is(13) \quad (8)$$

wherein b(1, j) and b(2, j) are sensitivity coefficients determined by the field configurations of the stigmators 12, 13 and the lenses 5a, 5b, (j=12–13). As discussed above, the sensitivity coefficients may be determined by computer simulation or by actual measurement. If Coulomb effect induced astigmatic blur and astigmatic distortions of a projected image are represented by $\Delta C_{ast}$ and $\Delta C_{dis}$ (=$\Delta$x+ i·$\Delta$y), respectively, then Is(12) and Is(13) of equations (7) and (8) may be determined by the following:

$$\Delta M_{ast} = -\Delta C_{ast} \quad (9)$$

$$\Delta M_{dis} = -\Delta C_{dis} \quad (10)$$

In a preferred method of the present invention, prior to exposure of a mask subfield, particular mask-pattern information is input to the controller 14 and stored by the memory device 15. Specifically, when the mask 6 comprises a scattering-stencil mask, the stored mask-pattern information is equal to the ratio of the total pattern-surface area relative to the surface area of a single subfield 60 and the pattern distributions on a subfield 60. When the mask 6 comprises a scattering-membrane mask, the mask-pattern information stored in the memory device is equal to the ratio of the surface area of the non-scattering portion of the mask relative to the surface area of a single subfield 60 and the particular pattern distributions on a selected subfield 60.

Prior to exposure of a selected mask subfield, the current density of the beam 2 irradiated onto the mask 6 is also input to the controller 14 and stored in the memory device 15. The controller 14 then calculates Coulomb effect induced shifts of the focal-point position, changes in magnification, rotation, and astigmatic blur and astigmatic distortions of a projected image based on the beam current density of the beam, and the stored mask-pattern information. Coulomb-effect corrections are calculated in advance of exposure by computer simulation or actual measurement based on the total current and a representative pattern group or distribution (i.e., stored mask-pattern information). The total current is determined based on the current density and open area or non-scattering area ratio of mask subfield 60. That is, Coulomb effect correction is determined based on beam current and mask pattern distribution.

The controller 14 then determines the appropriate adjustments of the electric current supplied to each of the correction lenses 9, 10, 11 based on equations (1)–(3) above, respectively. Further, the controller 14 determines an appropriate adjustment of the electric current supplied to each of the stigmators 12, 13 based on equations (7) and (8) above. Such electric current adjustments are made so as to eliminate shifts in focal-point position and low-order distortions. That is, the adjustments in current supplied to the components of the correction system substantially eliminate any negative effects of shifts in focal-point position, magnification, rotation, astigmatic blur and distortions of the projected image due to Coulomb effects.

Referring to FIG. 2, a lens-correction procedure of the preferred method of the present invention is described with reference to a scattering stencil mask. The lens-correction procedure is performed by control of the correction system by the controller 14. In step 1 (see FIG. 2), the current of the beam 2 at the upstream-facing wafer surface is calculated based on the current density of the beam 2 at the mask 6 and the group is determined using the above-mentioned stored mask-pattern information. In step 2, changes in the magnification and rotation of the projected image as well as astigmatic blur and astigmatic distortions of the projected image are determined based on the current of the beam and the group that the selected mask subfield 60 belongs to in step 1.

Still referring to FIG. 2, in step 3, the excitation currents I9, I10, I11, Is(12), and Is(13) of the correction lenses 9, 10, 11 and stigmators 12, 13, respectively, are each adjusted to a respective magnitude sufficient to achieve the calculated correction amounts $\Delta z$, $\Delta m$, $\Delta \theta$, $\Delta M_{ast}$, and $\Delta M_{dis}$, respectively, as determined in step 2. In step 4, the selected subfield 60 of the mask 6 is then exposed. The process of steps 1–3 is preferably repeated for each subfield 60 of the mask, and the correction data results are stored in the memory device 15 prior to exposure. Step 4 is then performed so that all of the mask subfields 60 are exposed based on the stored correction data.

The preferred embodiment of the correction process (as described above) determines any shifts in the focal-point position and image distortions and blur by performing calculations that are based on the current density of the beam 2 and stored pattern information. Alternatively, shifts in the focal-point position and image distortions/blur can be determined by actual measurement. For example, corrections can be made based on data that is input during the exposure of each subfield 60 by first performing exposures for all of the subfields 60, measuring for each subfield the actual focal-point position and image distortions and blur, and storing this measurement data in the memory 15. Subsequent wafer exposure may then be corrected to eliminate such distortions and aberrations.

The preferred method of the present invention is described above with reference to a mask 6 having a pattern divided into multiple subfields 60, as shown in FIG. 3(a). The mask pattern shown in FIG. 3(a) is divided into at least one primary region 100. The primary region 100 is further divided into a plurality of main fields 101 and the main fields 101 are further divided into a plurality of subfields 60. Prior to exposing the patterns defined within each subfield 60, any shifting of the focal-point position, distortions, and aberrations of the projected image that occur due to Coulomb effects are corrected.

Although the preferred method of the present invention is described with reference to a mask 6 having a pattern divided into multiple subfields 60, as shown in FIG. 3(a), the apparatus and methods of the present invention may also be used with a variety of types of divided-mask patterns. For example a mask 6 having a pattern divided as shown in FIG. 3(b) may be used, wherein the mask pattern is divided into at least one primary region 100. The primary region 100 is further divided into a plurality of main fields 101. Each main field 101 is further divided into a plurality of elongated rectangular portions or "strips" 102 extending across the width of the subject main field 101.

During exposure of the mask 6 illustrated in FIG. 3(b), the CPB 2 is scanned along each strip 102 with a fixed-shape beam 103 (see FIG. 3(c)). Preferably, the fixed-shape beam 103 has a square transverse profile to further reduce Coulomb effect induced distortions and blurs of projected images. The method of the determining distortion and blur-correction values described above may be employed when using a mask having a pattern divided as shown in FIG. 3(b). However, rather than determining the correction values for each subfield 60 of the mask 6 (as shown in FIG. 3(a)), the correction values for each region irradiated by beam 103 may be determined. Because the beam 103 continuously scans the strips 102, it is preferable to determine correction values for the entire pattern area of each strip 102. However, because such correction values may not be effective for the entire length of each strip 102, correction values for portions of each strip 102 may alternatively be determined. For example, the correction values may be determined every 10 $\mu$m within each strip 102. Alternatively, the correction values may be determined as often within each strip 102 as warranted by the magnitude of the Coulomb effect.

By use of the apparatus and methods of the present invention, shifting of the focal-point position and astigmatic blur of projected images, as caused by the Coulomb effect, are controlled and significantly reduced. Further, low-order distortions due to Coulomb effects, e.g., change in magnification, rotation, and astigmatic distortions of projected images, are corrected to less than a few nanometers.

Whereas the invention has been described with reference to multiple embodiments, it will be understood that the invention is not limited to those embodiments. On the contrary, the invention is intended to encompass all modifications, alternatives, and equivalents as may be included within the spirit and scope of the invention as defined by the appended claims.

What is claimed is:

1. A method of transferring a mask-pattern image to a sensitive substrate using a charged-particle-beam projection-microlithography apparatus, the method comprising:

(a) emitting a charged-particle beam from a charged-particle-beam source;

(b) illuminating the charged-particle beam onto a region of a pattern defined by a mask;

(d) imaging the charged-particle beam transmitted by the region of the mask to project a pattern image of the region toward a sensitive substrate;

(e) positioning a correction system comprising a correction lens system and two stigmators downstream of the mask and connecting components of the correction system to a power supply so as to receive electric currents there from;

(f) determining a focal-point position correction amount, a magnification-correction amount, a rotation-correction amount, an astigmatic-blur correction amount, and an astigmatic-distortion correction amount for correcting Coulomb effect induced shift in the focal-point position, magnification error, rotation error, astigmatic-blur error, and astigmatic-distortion error, respectively, of the pattern image;

(g) calculating the level of electric current to be applied to the correction lens system and stigmators to correct for the Coulomb effect induced shift in a focal-point position, magnification error, rotation error, astigmatic-blur error, and astigmatic distortion error of the pattern image, the level of electric current being based on the focal-point position correction amount, the magnification-correction amount, the rotation-correction amount, the astigmatic-blur correction amount, and the astigmatic-distortion correction amount, respectively;

(h) applying the calculated level of electric current to the correction lens system and stigmators; and (i) forming the pattern image of the region on a corresponding region of the sensitive substrate.

2. The method of claim 1, wherein the focal-point position correction amount, the magnification-correction amount, and the rotation-correction amount for correcting the Coulomb effect induced shift in a focal-point position, magnification error, and rotation error of the pattern image are determined by the following equations:

$$\Delta z = a(1, 9) \cdot I9 + a(1, 10) \cdot I10 + a(1, 11) \cdot I11$$

$$\Delta m = a(2, 9) \cdot I9 + a(2, 10) \cdot I10 + a(2, 11) \cdot I11$$

$$\Delta \theta = a(3, 9) \cdot I9 + a(3, 10) \cdot I10 + a(3, 11) \cdot I11$$

wherein I9, I10, and I11 are the magnitudes of the respective electric currents supplied to lenses 9, 10, 11 of the correction lens system, respectively, a(1, j), a(2, j), and a(3, j) are sensitivity coefficients based on the configuration of the lenses of the correction lens system, and j=9–11.

3. The method of claim 1, wherein the positioning of stigmators downstream of the mask further comprises positioning a first stigmator downstream of the mask for correcting Coulomb effect induced astigmatic blur and distortion of the projected image of the region by applying an electric current to the first stigmator.

4. The method of claim 3, wherein the positioning of the stigmators downstream of the mask further comprises positioning a second stigmator downstream of the first stigmator for correcting Coulomb effect induced astigmatic blur and distortion of the projected image of the region by applying an electric current to the second stigmator.

5. The method of claim 2, wherein the astigmatic-blur correction amount and the astigmatic-distortion correction amount are determined by the following equations:

$$\Delta M_{ast} = b(1, 12) \cdot Is(12) + b(1, 13) \cdot Is(13)$$

$$\Delta M_{dis} = b(2, 12) \cdot Is(12) + b(2, 13) \cdot Is(13)$$

wherein Is(12) and Is(13) are the magnitudes of the respective electric currents supplied to the first stigmator 12 and the second stigmator 13, respectively, b(1,j) and b(2,j) are sensitivity coefficients based on field configurations of the first and the second stigmators, and j=12–13.

* * * * *

UNITED STATES PATENT AND TRADEMARK OFFICE
CERTIFICATE OF CORRECTION

PATENT NO. : 6,096,462
DATED : August 1, 2000
INVENTOR(S) : Shohei Suzuki

Page 1 of 1

It is certified that error appears in the above-identified patent and that said Letters Patent is hereby corrected as shown below:

Column 4,
Line 47, change "XY plane" to -- X-Y plane -- (Application, Page 6, Line 23).

Claims,
Column 9,
Line 5, change "(d)" to -- (c) --
Line 8, change "(e)" to -- (d) --
Line 14, change "(f)" to -- (e) --
Line 22, change "(g)" to -- (f) --
Line 33, change "(h)" to -- (g) --
Line 35, change "(i)" to -- (h) -- .

Signed and Sealed this

Thirteenth Day of November, 2001

*Attest:*

NICHOLAS P. GODICI
*Attesting Officer*    *Acting Director of the United States Patent and Trademark Office*